US005568576A

United States Patent [19]

Takai et al.

[11] Patent Number: 5,568,576
[45] Date of Patent: *Oct. 22, 1996

[54] OPTICAL PARALLEL TRANSMISSION DEVICE

[75] Inventors: Atsushi Takai; Hajime Abe, both of Kokubunji, Japan

[73] Assignee: Hitachi, Ltd., Tokyo, Japan

[*] Notice: The term of this patent shall not extend beyond the expiration date of Pat. No. 5,448,661.

[21] Appl. No.: 508,140

[22] Filed: Jul. 27, 1995

Related U.S. Application Data

[63] Continuation of Ser. No. 49,714, Apr. 20, 1993, Pat. No. 5,448,661.

[30] Foreign Application Priority Data

Apr. 23, 1992 [JP] Japan ................................. 4-104278

[51] Int. Cl.$^6$ ..................................................... G02B 6/28
[52] U.S. Cl. .................. 385/24; 385/17; 385/23; 359/152; 359/154
[58] Field of Search ............................. 385/24, 17, 23; 359/152, 154, 107, 140, 163, 173, 164

[56] References Cited

U.S. PATENT DOCUMENTS 5,202,940 4/1993 Betts .......................................... 385/24
5,253,094 10/1993 Smith et al. ............................ 385/24
5,448,661 9/1995 Takai et al. ............................ 385/24

FOREIGN PATENT DOCUMENTS 0419216 3/1991 European Pat. Off. .
3818392 12/1989 Germany .
64-48011 2/1989 Japan .
WO92/00538 1/1992 WIPO .

OTHER PUBLICATIONS

K. Kaede et al.: *Twelve–channel parallel optical fiber transmission using a low–drive–current 1.3–µm LED array and a PIN PD array*, Technical Digest Of 1989, O.F.C.C., TUD 3 (no month).

Ota et al.: *Multi–Channel Optical Data Link (MODULINK)*, Third Electronics Conference (OEC' 90) 11D1–5 Technical Digest, Jul. 1990.

Primary Examiner—John D. Lee
Assistant Examiner—Phan T. H. Palmer
Attorney, Agent, or Firm—Kenyon & Kenyon

[57] ABSTRACT

A parallel optical transmission device is disclosed, which comprises a transmitter section having one or a plurality of transmitter modules converting one or a plurality of input electric signals into optical signals; a section consisting of bundles of optical waveguides 20i, j transmitting the optical signals; and a receiver section having one or a plurality of receiver modules reproducing the electric signals from the optical signals thus transmitted to output them; wherein all propagation delay times from the input electric signals to the output electric signals are set in predetermined regions.

7 Claims, 13 Drawing Sheets

OPTICAL PARALLEL TRANSMISSION DEVICE

This is a continuation of application Ser. No. 08/049,714 filed Apr. 20, 1993 now U.S. Pat. No. 5,448,661.

BACKGROUND OF THE INVENTION

The present invention relates to an optical transmission device and in particular to a parallel synchronous transmission device using a bundle of optical waveguides such as an optical fiber array, etc. and a transmission system using same.

Signal transmission techniques with a high speed and a high density are required in a computer or an exchange and transmission system. It is predicted that in electric signal transmission using coaxial cables or transmission paths utilized heretofore there is a limit in the speed and the density due to crosstalk, electric power consumption in transmission circuits, etc. On the contrary, an optical waveguide has in general a wide pass band and a low crosstalk. Further it is a light and fine line. In addition, there are no problems due to a grounding potential difference.

As described in Reference 1) K. Kaeda et al., "Twelve-channel parallel optical fiber transmission using a low drive-current 1.3 μm LED array and a PIN PD array", Technical Digest of 1989 Optical Fiber Communication Conference, TUD3 and Reference 2) Y. Ota and R. G. Swartz, "Multi-channel Optical Data LINK (MODLINK)" Third Optoelectronics Conference (OEC'90) Technical Digest, 11D1-5, a plurality of signals are optically transmitted in parallel by means of an optical element array and an optical waveguide array which contrasts with to prior art transmission by means of one optical waveguide (optical fiber).

As described in the two references cited above, one of the most serious problems in a parallel transmission device consists in skew within an array. Reference 1) states that skew in a 12-channel 1 km multimode fiber (GI62.5) array is 8 ns. On the other hand, Reference 2) describes that skew within an array in a 12-channel multimode fiber (62.5/125GI) ribbon is 10 ns/km and that in practice skew compensation is necessary. In FIG. 1 of Reference 2), an optical deskewer is connected after an transmitter (Tx).

These prior art examples discuss skew within an array in a parallel transmission device (link array) using one fiber array or a fiber ribbon. According thereto, the number of channels in parallel in the array should be increased in order to increase the number of channels in parallel of signals. However there is a limit in the number of channels in parallel due to a limit in production.

Reference 2) deals with the possibility of extension. Since this system is characterized in skew regulation of an optical fiber for every channel, it is possible to increase the number of channels thereof by effecting skew regulation for all the channels. However, by this method, since the skew regulation is effected for every combination of fibers and transmitting-receiving modules, there are problems in productivity, maintenance, etc.

Conventionally,.for example, Japanese patent publication JP-A 64-48011 discloses a parallel data transmission optical cable which performs parallel transmission of data at high speed between computers and between computer terminals using a plurality of optical fibers.

SUMMARY OF THE INVENTION

The present invention provides means for realizing multi-channel parallel synchronous transmission, which is excellent in mass productivity, ease of maintenance, economic property and exchangeability and which can be standardized.

In order to achieve this, signal propagation time is controlled. The skew represents relative time differences between different signal propagation times and absolute time of the signal propagation time for every array is controlled for securing simultaneous arrival of signals for different arrays. The number of channels in parallel can be increased without regulation by arranging in parallel a number of transmitting-receiving modules, for which this absolute time of the signal propagation time is controlled.

In order to realize this control, the respective signal propagation times from an electric signal input to an optical output reference plane (or optical connector contact plane) in a transmitter section (or module) and from an optical input reference plane (or optical connector contact plane) to an electric signal output in a receiver section (or module) and the signal propagation time for each of bundles of optical waveguides such as fiber arrays, etc. are regulated so as to be in regions predetermined for them, respectively. In this way it is possible to standardize different parts and to realize a high productivity, an easy maintenance, a good economic property and a high exchangeability.

DETAILED DESCRIPTION

Figure 1:
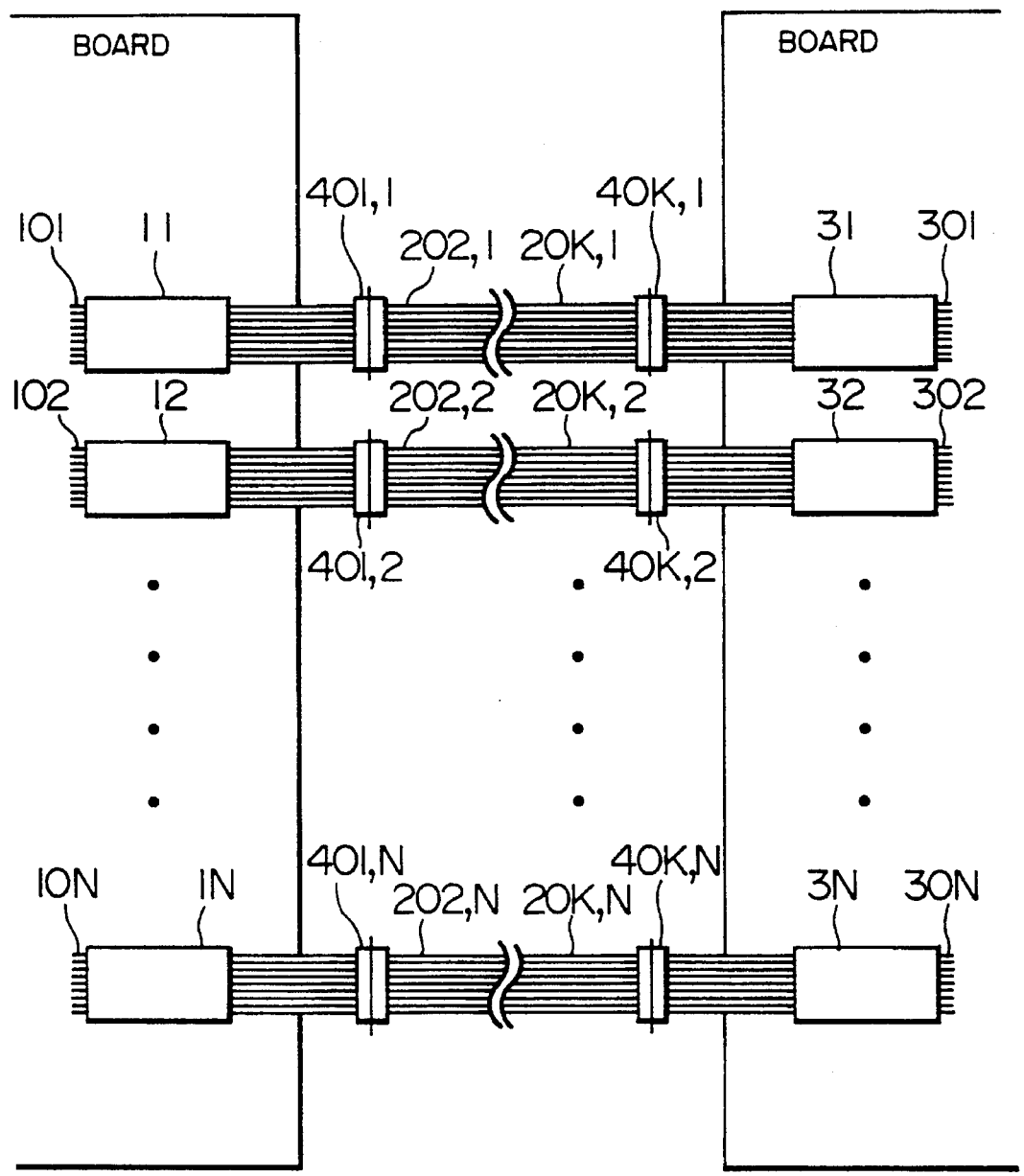
FIG. 1 indicates the operation of the present invention.

FIG. 1 indicates the principle of the present invention. An optical parallel transmission device according to the present invention is composed of transmitter modules 1*j* (j=1~N) having multi-channel connectors 401, j (j=1~N), receiver modules $3j$ ($j=1\sim N$) having multi-channel connectors $40K$, $j$ ($j=1\sim N$) and bundles of optical waveguides $20i$, $j$ ($i=2\sim K$, $j=1\sim N$) connected therewith through multi-channel connectors $40i$, $j$ ($i=2\sim K$, $j=1\sim N$).

Electric signals inputted to the transmitter modules $1j$ ($j=1\sim N$) are converted into optical signals propagated to the receiver modules $3j$ ($j=1\sim N$), where corresponding output electric signals are reproduced. At this time, signals inputted through pins $10j$ ($j=1\sim N$) can be transmitted synchronously to pins $30j$ ($j=1\sim N$) owing to the fact that the absolute value of propagation time from the input pins $10j$ ($j=1\sim N$) for the input electric signals to the output pins $30j$ ($j=1\sim N$) for the output electric signals is set in a predetermined region.

At this time, the signal propagation times from the input pins $10j$ ($j=1\sim N$) to the multi-channel connectors $401$, $j$ ($j=1\sim N$), from the multi-channel connectors $40i$, $j$ ($i=2\sim K$, $j=1\sim N$) to $40K$, $j$ ($j=1\sim N$) and from the multi-channel connectors $40K$, $j$ ($j=1\sim N$) to the output pins $30j$ ($j=1\sim N$) are set in predetermined regions, respectively. In this way, parts can be standardized and it is possible to realize an easy maintenance, a good economic property and a high exchangeability.

FIG. 1 indicates only the basic construction and in practice various variations are conceivable for the construction of the bundles of optical waveguides. In particular cables consisting of different numbers of optical waveguides may be used between different multi-channel connectors. For example, it can be thought that between the multi-channel connectors $401$, $j$ ($j=1\sim N$) and $402$, $j$ ($j=1\sim N$) n waveguides, n being the number of channels in each transmitter module, are bundled in one cable and between the multi-channel connectors $402$, $j$ ($j=1\sim N$) and $403$, $j$ ($j=1\sim N$) nN waveguides are bundled in one cable so that they are connected apparently through one cable. Further, when the transmitter or receiver modules are of plug-in type, the propagation time between the end plane of the optical waveguides in each module and the input or output electric signal pins may be within a predetermined region.

Further, although data transmission in one direction is indicated in FIG. 1, a bidirectional structure is also conceivable.

As described above, various structures are conceivable and for all of them it is possible to intend to standardize parts and to effect synchronous transmission with a great number of channels in parallel by setting the signal propagation time for every part in a predetermined region.

Hereinbelow the first embodiment will be explained, referring to FIGS. 2 to 10.

Figure 2:
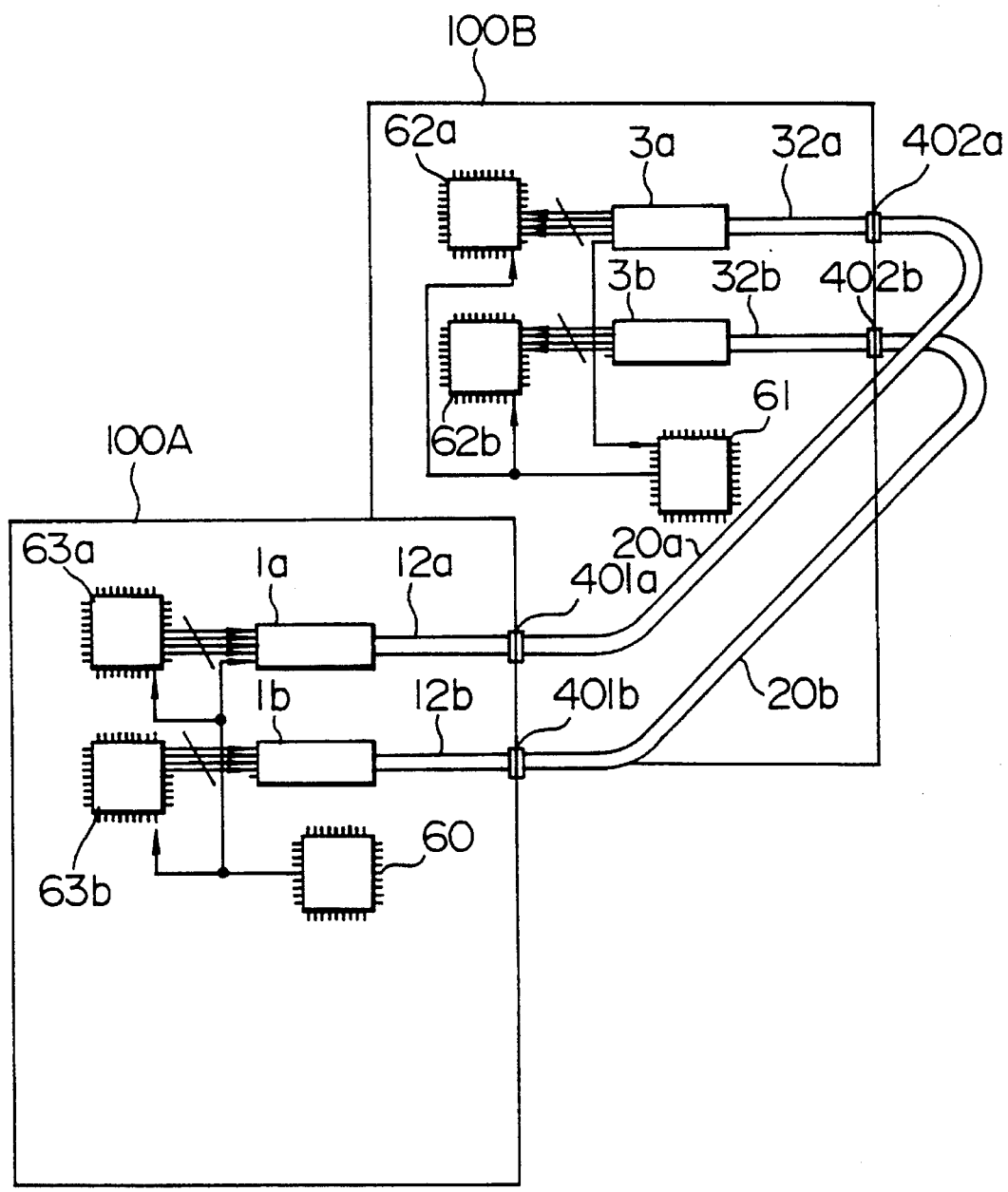
FIG. 2 shows the construction of a first embodiment of the present invention.

FIG. 2 shows the construction thereof. Transmitter modules $1a$ and $1b$ and receiver modules $3a$ and $3b$ for optical parallel transmission with pigtail fiber arrays are mounted on boards $100A$ and $100B$, respectively, on which logic circuits within a logic device are mounted, which modules are connected through fiber array cables $20a$ and $20b$, respectively.

8-bit data of an IC $63a$ on the board $100A$ and clocks from a clock distributing IC $60$ are transmitted synchronously in parallel to an IC $62a$ and a clock distributing IC $61$ on the board $100B$ through the transmitter module $1a$, a fiber array $20a$ including 9 fibers and a receiver module $3a$. Similarly 8-bit data of an IC $63b$ on the board $100$ A are transmitted synchronously in parallel to an IC $62b$ on the board $100B$ through the transmitter module $1b$, a fiber array $20b$ and a receiver module $3b$. In the present embodiment, a reference clock is generated on the board $100$ A and it is distributed to the board $100B$.

Hereinbelow a hardware construction will be indicated.

The transmitter and receiver modules $1a$, $1b$, $3a$ and $3b$ include pigtail fiber arrays $12a$, $12b$, $32a$ and $32b$, respectively, each of which has a multi-channel optical connector at one end thereof. The multi-channel optical connector is fixed by an edge of a board. This edge was applied to the back panel side and to a front panel, which is opposite thereto. When the multi-channel optical connector was fixed to the edge on the back panel side, a plug-in type multi-channel connector was mounted on the back panel.

Figure 3:
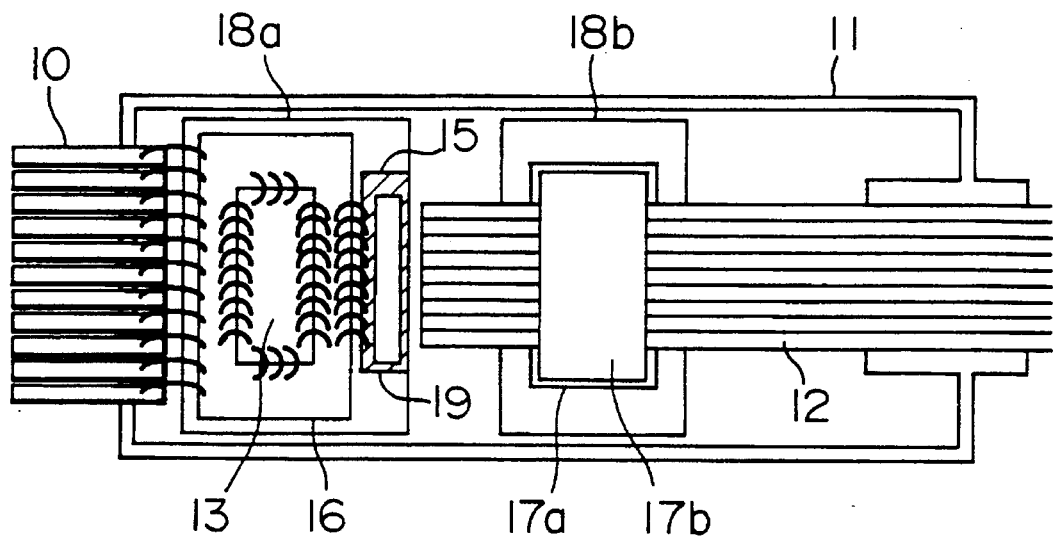
FIG. 3 shows the construction of a transmitter module to be used in the embodiment of FIG. 2.
Figure 4:
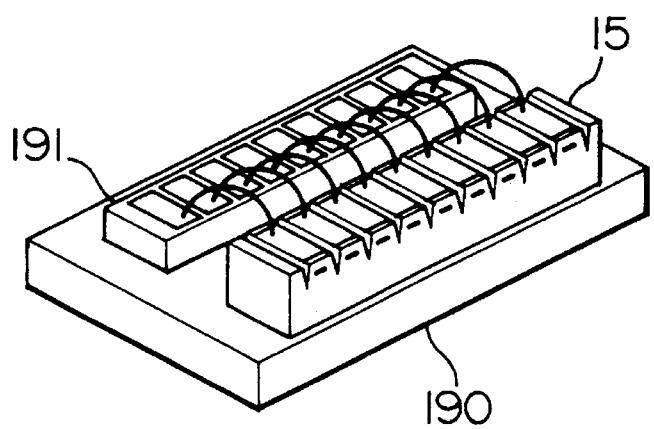
FIG. 4 is a perspective view of a laser array submount to be used in the transmitter of FIG. 3.
Figure 5:
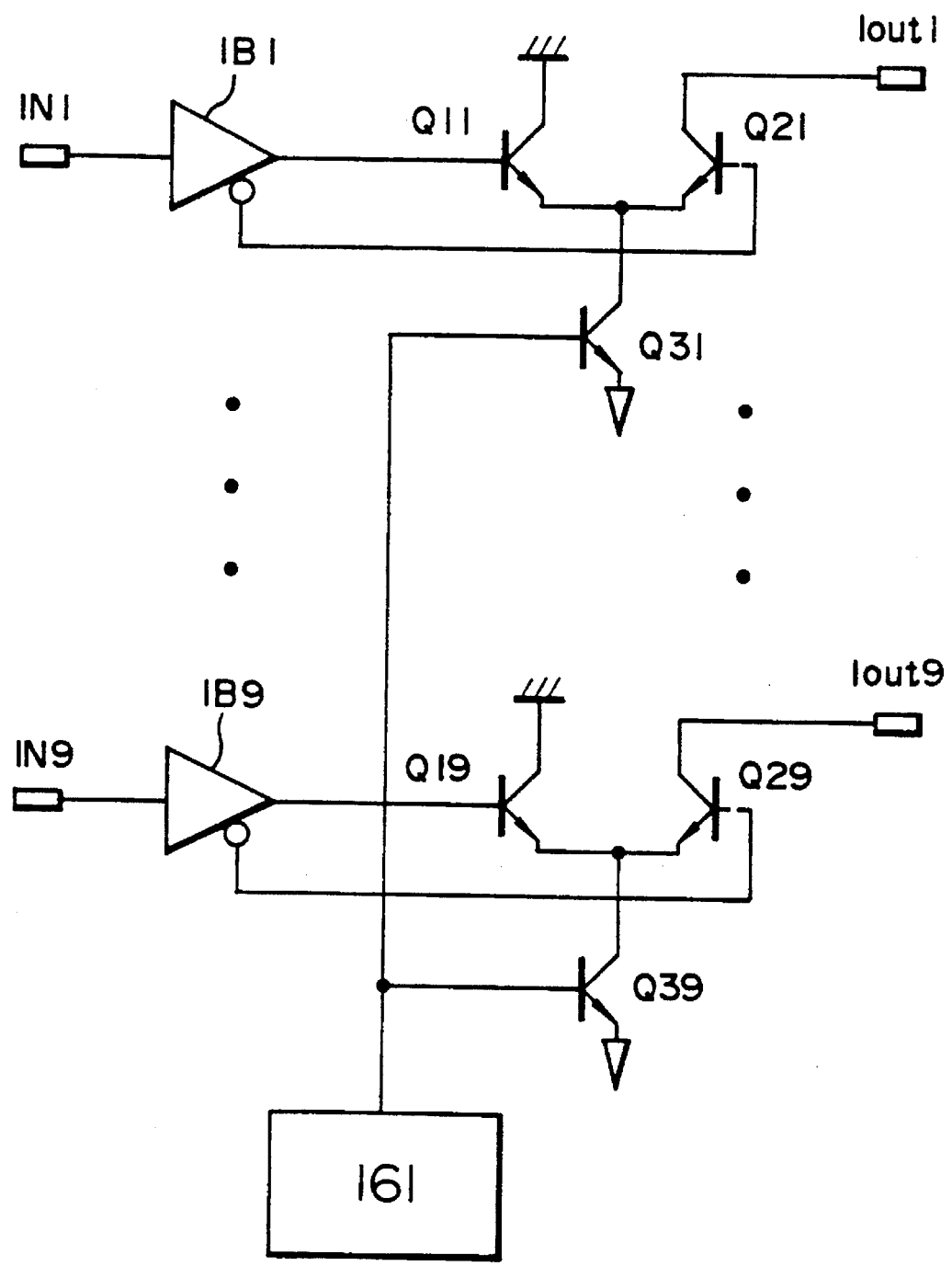
FIG. 5 is a block diagram of a transmitting IC circuit.
Figure 6:
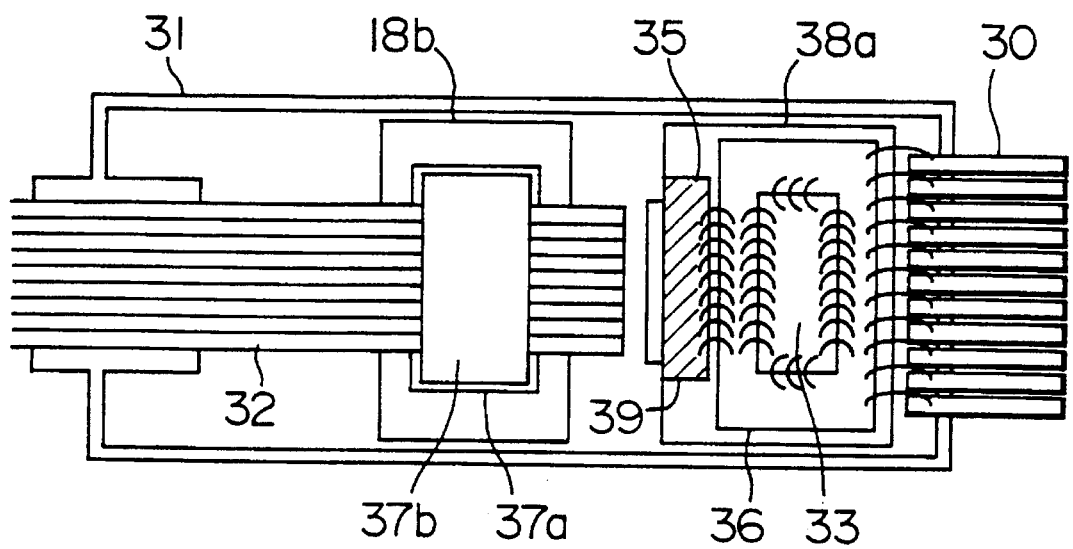
FIG. 6 shows the construction of a receiver module to be used in the embodiment of FIG. 2.
Figure 7:
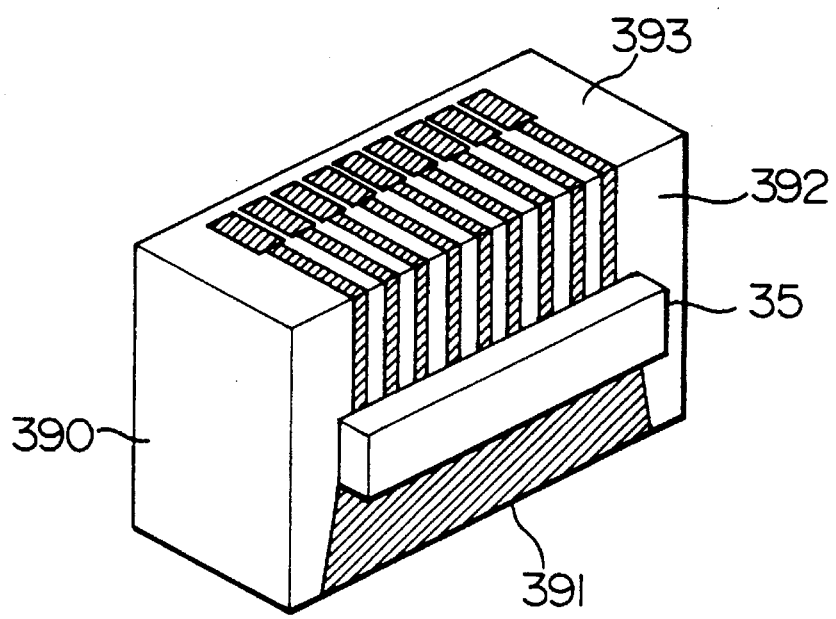
FIG. 7 is a perspective view of a photodiode array submount to be used in the receiver of FIG. 6.
Figure 8:
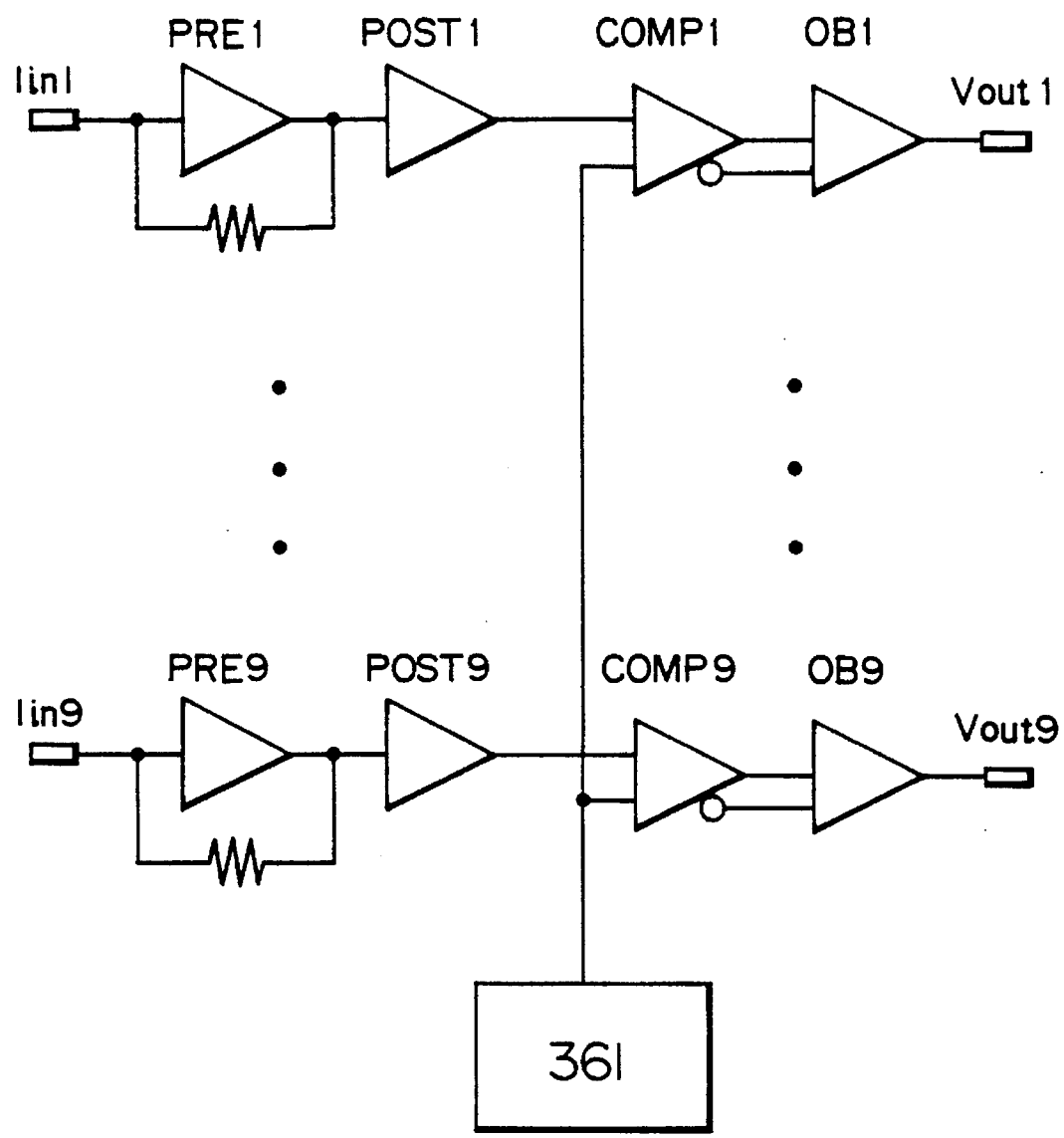
FIG. 8 is a block diagram of a receiving IC circuit.

FIGS. 3 and 6 indicate the construction of the transmitter and the receiver module used in the present embodiment respectively; FIGS. 4 and 7 represent a laser array and a photodiode array, respectively, mounted on a submount; and FIGS. 5 and 8 are block diagrams indicating a transmitting and a receiving IC circuit, respectively. In FIGS. 3 and 6 a part of the pigtail fiber array and the multi-channel optical connectors are omitted.

The transmitter module indicated in FIG. 3 consists of 9 electric signal inputs and 2 pins for power supply $10$; an IC substrate $16$, on which a laser array driving IC $13$ is mounted; a laser array $15$ secured to a submount $19$; a 9-channel pigtail fiber array $12$; a first metal block $18a$, to which the IC substrate $16$ and the laser array submount $19$ are secured by soldering; a piece of silicon $17a$ having V-shaped grooves for fixing fibers of the pigtail fiber array $12$ at predetermined positions and a piece of silicon $17b$ for pressing down the fibers and fixing them by soldering; and a second metal block $18b$, on which the piece of silicon $17a$ is fixed by soldering, and a metal package $11$ accommodating these parts. Electric signals inputted through the pins $10$ drive the laser array in the IC $13$ to be converted into optical signals, which are sent to the fiber array.

Optical coupling between the laser array $15$ and the fiber array $12$ is effected by holding the first and the second metal block $18a$ and $18b$ in such a positional relationship that coupling between the two ends of the arrays is maximum in a state where the lasers are excited so as to emit light and by securing them to the metal package $11$ by soldering. At the optical coupling, provisional wire bonding on the wiring for light emission disposed on the IC substrate $16$ is effected so as to excite .the lasers at the two ends to emit light and the wiring is removed after the termination of the fixation of the optical coupling by soldering described above.

The part of the package, through which the pins $10$ and the fiber array $12$ were taken out, was constructed so as to be airtight, using solder. Further reliability of the module was increased owing to the fact that solder used in the package was fluxless.

The length of the pigtail fiber array was measured before the optical coupling and the multi-channel optical connector was formed at one end thereof. In the present embodiment the length of the fiber array is 26.0 cm; fluctuations in the length due to errors in the length measurement, abrasion of the fibers at the formation of the multi-channel optical connector, etc. are smaller than 3 mm; and the propagation time of the optical signals is shorter than 15 ps. Further the skew within the fiber array is smaller than about 1 ps.

The laser array is formed on a p conductivity type semiconductor substrate and this p conductivity type semiconductor substrate serves as a p side common terminal for all the lasers. The lasers are mounted on a submount and control of characteristics thereof, etc. are effected. FIG. 4 indicates the laser array mounted on the submount. The laser array $15$ is secured by soldering to the metal block $190$, to which a wiring board $191$ is soldered and every laser electrode is wirebonded with the wiring board. Since the metal package 11 is designed so as to be at the ground potential, the p side common terminal of the lasers is connected with the metal package 11 with low parasitic elements through the submount metal block 190 and the first metal block 18a to be grounded. In this way it was possible to reduce electric crosstalk in the laser array.

Each of the lasers has a multiple quantum well active layer structure; a short cavity of 150 μm; and a highly reflective end surface of 70%–90%. The interval between lasers is 250 μm and the threshold current is smaller than 3 mA.

FIG. 5 indicates the IC circuit. It was fabricated by using Si bipolar IC process. It is composed of a driving circuit section consisting of electric inputs INi (i=1~9); current outputs Iouti (i=1~9); input buffers IBi (i=1~9); constant current generating transistors Q3i (i=1~9); and a pair of transistors Q1i (i=1~9) and Q2i (i=1~9) switching constant currents thus generated, and a circuit 161 generating necessary control voltages. Since the threshold current was small, the no bias driving method was adopted. Modulation current was 20 mA. For the layout of the IC the driving circuits were arranged with the same interval as the lasers. In this way it was possible to reduce fluctuations in the delay time within the IC.

In the present embodiment using the construction described above the signal propagation time from the electric signal input pins 10 to the input end of the pigtail fiber was 0.2 ns±70 ps and the signal propagation time of the pigtail fiber was 1.3 ns±15 ps. The signal propagation time from the electric signal input pins 10 to the end of the multi-channel optical connector is 1.5 ns±85 ps. However, since the lasers are driven without bias, a light emission delay of at most 500 ps is produced at the rise.

The receiver module indicated in FIG. 6 consists of a 9-channel pigtail fiber array 32; a photodiode array 35 secured to a submount 39; an IC substrate 36, on which a receiver IC 33 is mounted; 9 electric signal outputs and 2 pins for power supply 30; a first metal block 38a, to which the IC substrate 36 and the photodiode array submount 39 are secured by soldering; a piece of silicon 37a having V-shaped grooves for fixing fibers of the pigtail fiber array 32 at predetermined positions and a piece of silicon 37b for pressing down the fiber cores and fixing them by soldering; and a second metal block 38b, on which the piece of silicon 37a is fixed by soldering, and a metal package 31 accommodating these parts. The electric signals are reproduced from the optical signals from the fiber array 32 by the photodiodes and the receiving IC and outputted through the pins 30.

Optical coupling between the photodiode array 35 and the fiber array 32 is effected by holding the first and the second metal block 38a and 38b in such a positional relationship that coupling between the two ends of the arrays is maximum in a state where light is inputted from the fibers at the two extremities of the fiber array and by securing them to the metal package 31 by soldering. At the optical coupling, provisional wire bonding on the wiring for light reception disposed on the IC substrate 36 is effected so as to monitor photocurrents of the photodiodes at the two extremities and the wiring is removed after the termination of the fixation of the optical coupling by soldering described above.

Similar to the transmitter module, the part of the package, through which the pins 30 and the fiber array 32 were taken out, was constructed so as to be airtight, using solder. Further reliability of the module was increased owing to the fact that solder used in the package was fluxless.

Similar to the transmitter module, the length of the pigtail fiber array was measured before the optical coupling and the multi-channel optical connector was formed at one end thereof. In the present embodiment the length of the fiber array is 26.8 cm; fluctuations in the propagation time of the optical signals are smaller than 15 ps. Further the skew within the fiber array is smaller than about 1 ps.

The photodiode array is formed on an n conductivity type semiconductor substrate and this n conductivity type semiconductor substrate serves as an n side common terminal for all the photodiodes. In order to reduce the capacity, a rear injection type was adopted. The photodiodes are mounted on a submount and control of characteristics thereof, etc. are effected. FIG. 7 indicates the photodiode array mounted on the submount. Three surfaces 391, 392 and 393 of a ceramic block 390 are metallized and patterned and the photodiodes are diebonded on the surface 392. The surface 393 is used for wiring the wire-bonding with the IC substrate 36 and the surface 391 is used for grounding pattern. It was possible to reduce electric crosstalk produced on the ground side of the photodiodes owing to the fact that the photodiode array was grounded to the metal package 31 with low parasitic elements through the first metal block 38a, using the grounding pattern.

FIG. 8 indicates the IC circuit. Similar to the transmitter module, it was fabricated by using Si bipolar IC process. It is composed of a channel receiving circuit section consisting of photocurrent input terminals Iini (i=1~9); signal outputs Vouti (i=1~9); preamplifying circuits PREi (i=1~9); post amplifiers POSTi (i=1~9); COMPi (i=1~9) having discriminating function; and output buffers OBi (i=1~9), and a circuit 361 generating necessary control voltages. For the layout of the IC the circuits were arranged with the same interval as the photodiodes. In this way it was possible to reduce fluctuations in the delay time (skew) within the IC. However, in this receiving circuit, since the amplification factor is not regulated, depending on inputted light power, increase or decrease in the amplitude due to variations in the decision point at rise/fall is produced.

In the present embodiment using the construction described above the signal propagation time from the pigtail output end to the electric signal output pins 30 was 1.2 ns±135 ps and the signal propagation time of the pigtail fiber was 1.3 ns±15 ps. The signal propagation time from the multi-channel optical connector to the electric signal output pins 30 was 2.5 ns±150 ps. However, since a fixed amplification/fixed decision point method is used, the pulse width increases or decreases within a region of a half of rise/fall time, depending on light input power.

The two boards are connected through a fiber array cable having multi-channel optical connectors at the two ends. In the present embodiment single mode fibers were used for all the fiber arrays including the pigtail. The propagation delay time of a fiber array cable was around 500 ns and fluctuations thereof were 400 ps.

A method for fabricating a cable, whose propagation delay time is controlled with a high precision, will be explained. At first, a fiber array cable longer than that determined by a required propagation time is cut out from a cable, using a length measuring apparatus. In the present embodiment the cable thus cut out is 101 m long. The precision of the length measuring apparatus is about 50 cm for this extent of length. Therefore the propagation delay of the fiber array is in a region from 5002.5 to 5007.5 ns. A multi-channel optical connector is connected at one end of this fiber array cable. In the present embodiment the length of the fiber array cable lost thereby is shorter than 1 mm, which corresponds to a propagation time shorter than 0.005 ns.

Figure 9:
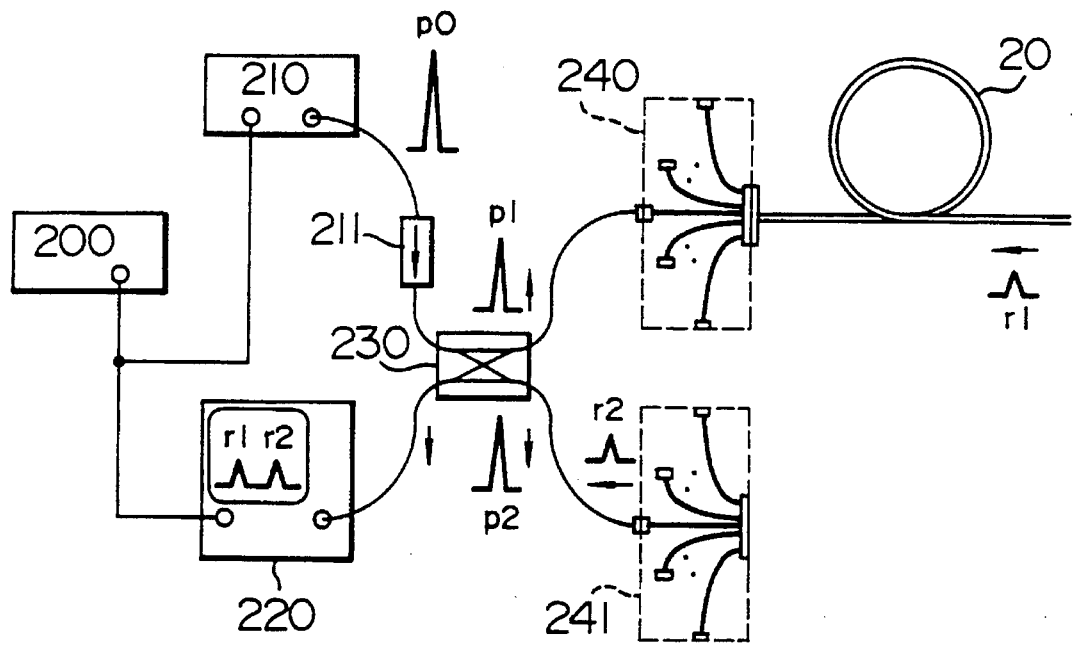
FIG. 9 shows a system for measuring the propagation delay time in a fiber array cable.

FIG. 9 shows a system for measuring the propagation delay time of fiber array cables, which system is composed of a high precision oscillator 200; an extremely short light pulse generator 210 synchronized with the oscillator 200; an optical isolator 211; a light waveform measuring device 220; an optical bidirectional coupler 230; multi-channel optical connector—one channel optical connector converting jigs 240 and 241. Errors in the fiber length from the optical bidirectional coupler 230 to the multi-channel optical connector of each of the converting jigs 240 and 241 are smaller than 1 cm. Light pulses generated by the extremely short light pulse generator 210 are 40 ps wide. The fiber array cable 20, at one end of which the multi-channel optical connector is connected, described previously is connected with the converting jig 240 and the propagation time thereof is measured.

Measurement is effected by observing an arrival time difference of a reflected light pulse through fibers to be measured in the fiber array cable 20 by means of the light waveform measuring device 220. Repeated pulses are generated by the high precision oscillator 200 with a time interval, which is twice as long as the desired propagation time, or a time interval as short as the desired propagation time divided by an integer and light pulses p0 thus generated are inputted to the optical bidirectional coupler 230. The light pulses p0 are separated into light pulses p1 and p2 having almost identical light intensities by the optical bidirectional coupler 230. Respective reflected pulses r1 and r2 of the light pulses p1 and p2 are unified and superposition of the reflected lights r1 and r2 is observed. The arrival time difference of the reflected light r1 is observed by means of the light waveform measuring device 220, using the reflected light r2 as the reference, one half thereof being the propagation delay time of one fiber in the fiber array cable 20. Calibration is effected by carrying out measurements in a state without fiber array cable.

Figure 10:
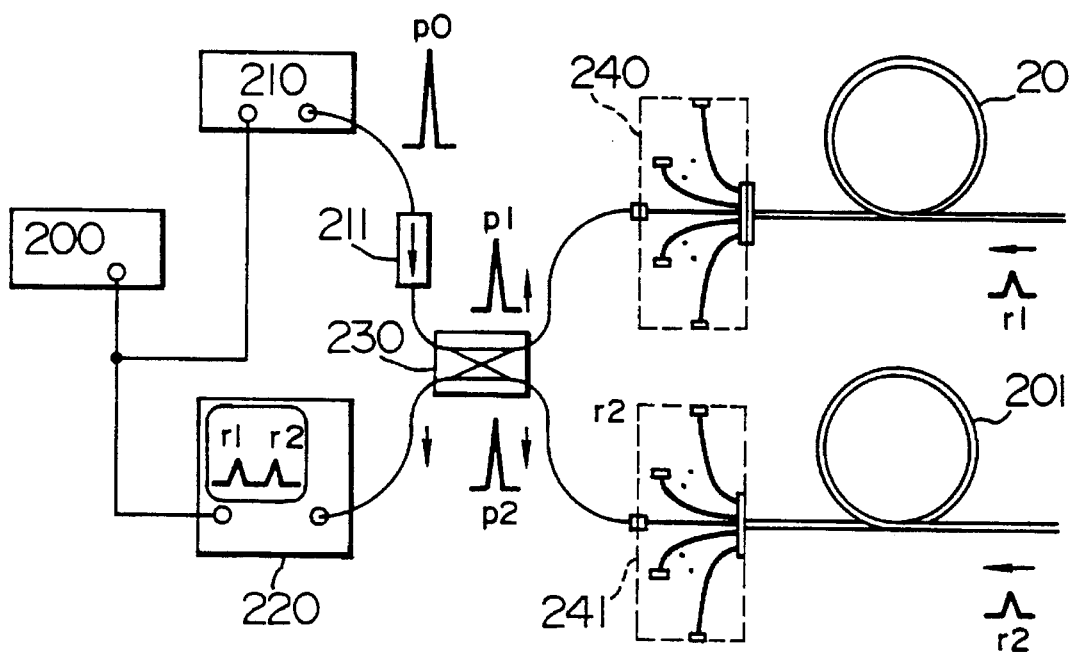
FIG. 10 shows a system for measuring the propagation delay time in a fiber array cable, using a reference fiber.

On the other hand, FIG. 10 shows a system for measuring the propagation delay time of a fiber array cable, using a reference fiber. Measurement is effected by the same principle as that explained, referring to FIG. 9, i.e., the arrival time difference of reflected light pulses from the reference fiber 201 and one fiber in the fiber array cable 20 is observed by means of the light waveform measuring device 220. Calibration is effected by carrying out measurements in a state without reference fiber 201 nor fiber array cable 20. The propagation delay time of the reference fiber 201 is measured by means of the system indicated in FIG. 9.

While measuring the propagation time by means of either the system indicated in FIG. 9 or FIG. 10, the cables are cut so that all the propagation times thereof are in a predetermined region, taking the fiber array length lost at the connection of the multi-channel optical connector into account. In the present embodiment the propagation delay time of one fiber in the fiber array cable is measured and errors in the propagation time are converted in the length with a rate of 5 ns/m. Errors were set at first below 500 ps (below 10 cm in the length) and at the second time they were set below 25 ps (below 0.5 cm in the length). At this time, since fluctuations of the propagation time among different fibers in a single mode fiber array are smaller than 3 ps/m, fluctuations in the propagation time among the different fibers in the cable are smaller than 300 ps, because the length of the cable in the present embodiment is about 100 m. Thereafter a multi-channel optical connector is connected at the open end of the cable. The propagation time of the fibers satisfies the specification (500 ns±400 ps), taking abrasion of the fibers at the mounting of the connector and measurement errors of 40 ps into account.

The apparent electric signal propagation time of the parallel transmission system using the transmitter-receiver modules and the fiber array cable is 504 ns±640 ps. In practice, the final specification on the fluctuations of the light propagation time is determined, taking fluctuations of the light propagation time due to wiring shape of the fiber array cable into account.

Since the signal propagation time of electric signals can be controlled with a high precision as described above, the two boards 100A and 100B can exchange data synchronously. Further synchronism can be kept, even if a plurality of such parallel transmission systems are wired in order to increase the amount of transmitted data.

However delay of rise due to delay in the laser light emission and increase or decrease in the pulse width due to jitter and rise/fall time in the receiving circuit should be taken into account. System design taking them into account is possible. Countermeasures against the delay in the laser light emission can be taken by latching it at a fall, for which no delay in the light emission takes place. Increase or decrease in the pulse width due to rise/fall time may be considered as wiring skew.

In order to reduce any increase or decrease in the pulse width due to rise/fall time, countermeasures can be taken by adding a circuit, which varies the amplification factor, depending on inputted light power and keeps the pulse width at the discrimination constant. However since these measures complicate the receiving circuit and increase electric power consumption, they are used only for signals specifically requiring them.

Although Si bipolar ICs are used in the above description, other kinds of ICs may be used, taking exchangeability with other logic circuits into account. Further, even if the kind of ICs and electric signal interfaces differ for the transmission and the reception, no problems take place, if the delay time by the ICs is controlled.

In addition, although a p conductivity type substrate is used for the laser array, an n conductivity type substrate may be used. Various sorts of structures may be conceivable. Further, although the no bias driving method is adopted for the sake of simplicity in the present embodiment, it is possible also to apply a bias voltage to ICs. Still further LEDs may be used. A p conductivity type substrate may be used also for the photodiode array. A front injection type may be also adopted.

Although single mode fibers are used, multimode fibers may be also used for distances as short as about 20 m. Further a combination, by which multimode is used only for the pigtail fiber in the receiver module, etc. is conceivable.

Hereinbelow a second embodiment of the present invention will be explained, referring to FIGS. 11 and 12.

Figure 11:
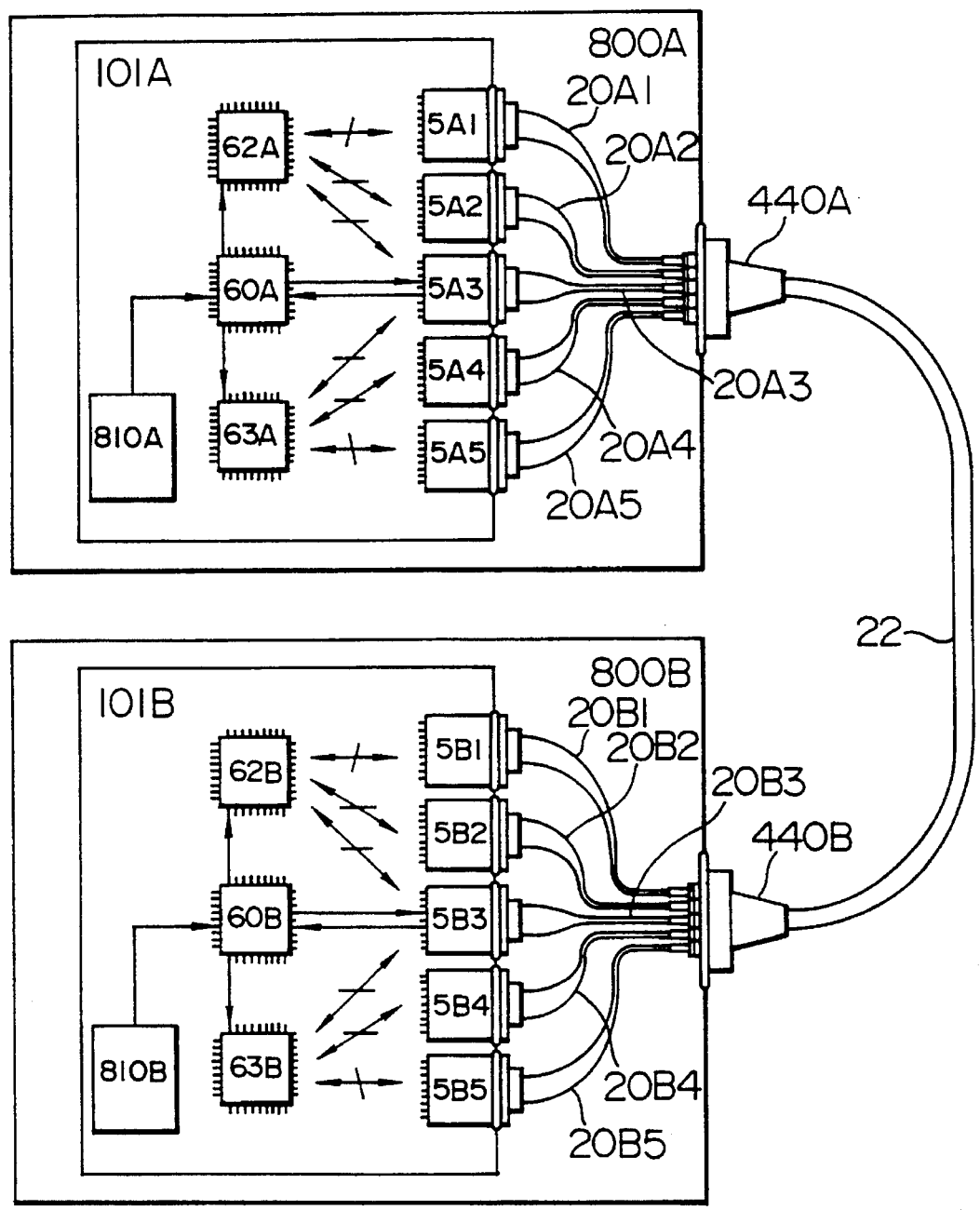
FIG. 11 shows the construction of a second embodiment of the present invention.

FIG. 11 shows the construction thereof. Transmitter and receiver modules 5A1~5 and 5B1~5 for parallel optical transmission are mounted on boards 101A and 101B in logic devices 800A and 800 B, respectively, and connected through two kinds of fiber array cables 20A1~5, 22 and 20B1~5. The transmitter and receiver modules 5A1~5 and 5B1~5 are constructed so as to have transmitting 16 channels and receiving 16 channels, i.e., 32 channels in all. Different devices are connected bidirectionally through 80 channels. Each of the fiber array cables 20A1~5 has 32 channels, which are composed of four 8-channel fiber arrays, and the fiber array cable 22 has 160 channels, which are constructed by bundling twenty 8-channel fiber arrays. Each of the fiber array cables 20A1~5 and 20B1~5 has two 32-channel optical connectors at the extremities. The fiber array cable 22 has two 160-channel optical connectors, each of which is composed of five 32-channel optical connectors, at the extremities. The light output section of each of the transmitter and receiver modules 5A1~5 and 5B1~5 consists of a 32-channel optical connector and the 32-channel optical connector at one end of each of the fiber array cables 20A1~5 is connected directly with a transmitter - receiver module package. The 32-channel optical connector at the other end of each of the fiber array cables 20A1~5 is connected with the 160-channel fiber array cable 22 through an optical connector adapter 440A mounted on the casing of the device 800A. The fiber array cable 22 is connected with the fiber array cables 20B1~5 through an optical connector 440B mounted on the casing of the device 800B.

Clocks for the devices 800A and 800B are supplied from clock generating - distributing sections 810A and 810B, respectively. Data signals transmitted - received and sent in parallel from clock distributing ICs 60A and 60B by transmitter - receiver modules 5A3 and 5B3 are synchronized with device clocks through elastic buffer ICs 62A, 63A and 62B, 63B, respectively.

Figure 12:
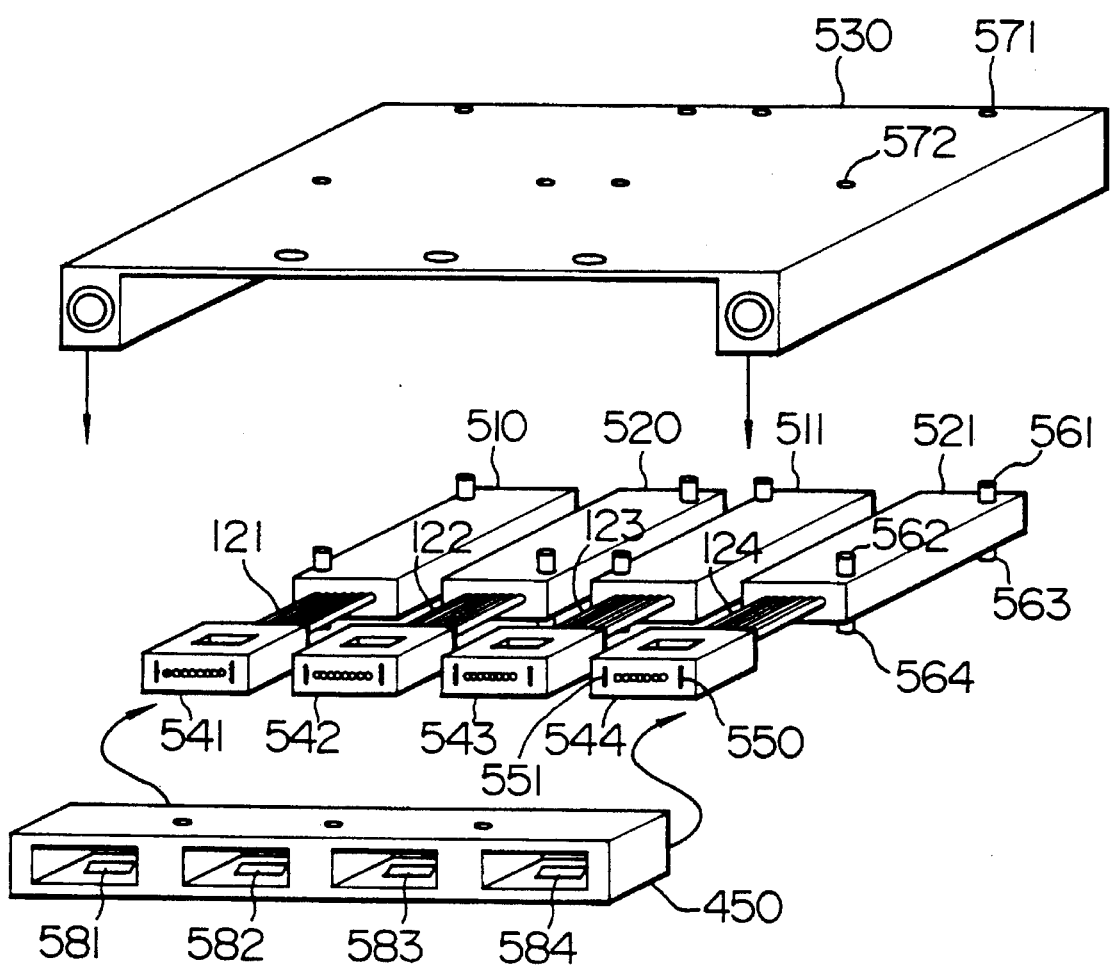
FIG. 12 shows the construction of a transmitter-receiver module to be used in the embodiment of FIG. 11.

FIG. 12 shows the construction of the transmitter - receiver modules 5A1~5 and 5B1~5. Each of the transmitter - receiver modules 5A1~5 and 5B1~5 is composed of two 8-channel transmitter submodules 510 and 511 and two 8-channel receiver submodules 520 and 521. The transmitter and the receiver modules have the same structure as the transmitter and the receiver modules indicated in FIGS. 3 and 6, respectively, although they are different in the number of channels. However the pigtail fiber arrays are as short as 36 mm and they are accommodated in packages. Further the different pigtail fiber arrays are connected with ferrules 541, 542, 543 and 544, respectively.

Each of the present transmitter - receiver modules 5 is constructed by securing the pigtail fiber array transmitter submodules 510 and 511 and the receiver submodules 520 and 521 assembled independently from each other with ferrules to the transmitter - receiver module package 530 acting also as a heat sink. Thereafter the 32-channel optical connector is assembled. Each of the ferrules 541, 542, 543 and 544 has two guide pins. (For example, the ferrule 544 has guide pin holes 550 and 551.) The 32-channel optical connector is secured to a ferrule case 450 so that these ferrules have a certain degree of freedom. For example, the ferrule 541 is fixed by two nails 581 (one of them being not seen in the figure) disposed on the upper and the lower side of the ferrule insertion hole therefor in the ferrule case 450.

Further each of the submodules has four positioning pins for the purpose of securing it to the transmitter - receiver module package 530 with a high precision and for effecting positioning of the electric pins with a high precision at mounting the boards. (For example, the submodule 521 has pins 561, 562, 563 and 564.) Holes, in which the pins are inserted, are formed in the transmitter - receiver module package 530 with a precision of 0.05 mm. (For example, holes 571 and 572 are formed in the submodule 521.) Further holes, in which the pins are inserted, are formed in the board with a precision of 0.1 mm.

The pigtail fiber arrays are 36 mm long both for the transmission and for the reception. Errors in the length measurement and fluctuations due to abrasion of fiber at the formation of the multi-channel optical connector are smaller than 3 mm and fluctuations in the optical signal propagation time are smaller than 15 ps. Further skew within an fiber array is smaller than about 1 ps.

In the present embodiment using the construction described above the signal propagation time from the electric signal input pins 10 to the pigtail input end was 0.2 ns±70 ps and the signal propagation time of the pigtail fiber was 0.18 ns±15 ps. The signal propagation time from the electric signal input pins 10 to the end of the multi-channel optical connector was 0.38 ns±85 ps. However, since the lasers are driven without bias, a light emission delay of at most 500 ps is produced at the rise.

In the present embodiment using the construction described above the signal propagation time from the pigtail output end to the electric signal output pins 30 was 1.2 ns±135 ps and the signal propagation time of the pigtail fiber was 0.18 ns±15 ps. The signal propagation time from the multi-channel optical connector to the electric signal output pins 30 was 1.38 ns±150 ps. However, since a fixed amplification/fixed discrimination point method is used, the pulse width increases-or decreases within a region of a half of rise/fall time, depending on light input power.

The boards are connected through two kinds of fiber array cables. Each of the fiber array cables 20A1~5 and 20B1~5 has 32 channels, which are composed of four 8-channel fiber arrays, and the fiber array cable 22 has 160 channels, which are constructed by bundling twenty 8-channel fiber arrays. Also in the present embodiment, single mode fibers are used for all the fiber arrays including the pigtails. The propagation delay times of the 32-channel and the 160-channel fiber array cable are in predetermined regions. The skew in the 32-channel fiber array cable is 3 ps/m similar to Embodiment 1. However the skew in the 160-channel fiber array cable is 8 ps/m due to the shape effect of bundled fibers. In the present embodiment a specification was so decided that the propagation delay times of the 32-channel and the 160-channel fiber array cable are in regions of 10.0 ns±6 ps (about 2 m) and 500 ns±800 ps (about 100 m), respectively.

The propagation delay time in this system was 521.8 ns±2.0 ns. In the present embodiment, since clocks are transmitted together with signals and synchronization is realized by means of elastic buffers on the receiver side, the propagation delay time and the clocks may be independent.

By the 32-channel fiber cable array information transmission as effected in two opposite directions, using two 8-channel fiber arrays (or 16 fibers) for each direction. By the 160-channel fiber cable array information transmission is effected in two opposite directions, using ten 8-channel fiber arrays (or 80 fibers) for each direction.

According to the present embodiment parallel synchronous transmission can be effected bidirectionally by using one fiber array cable between two devices.

Hereinbelow a third embodiment of the present invention will be explained, referring to FIGS. 13 to 17.

Figure 13:
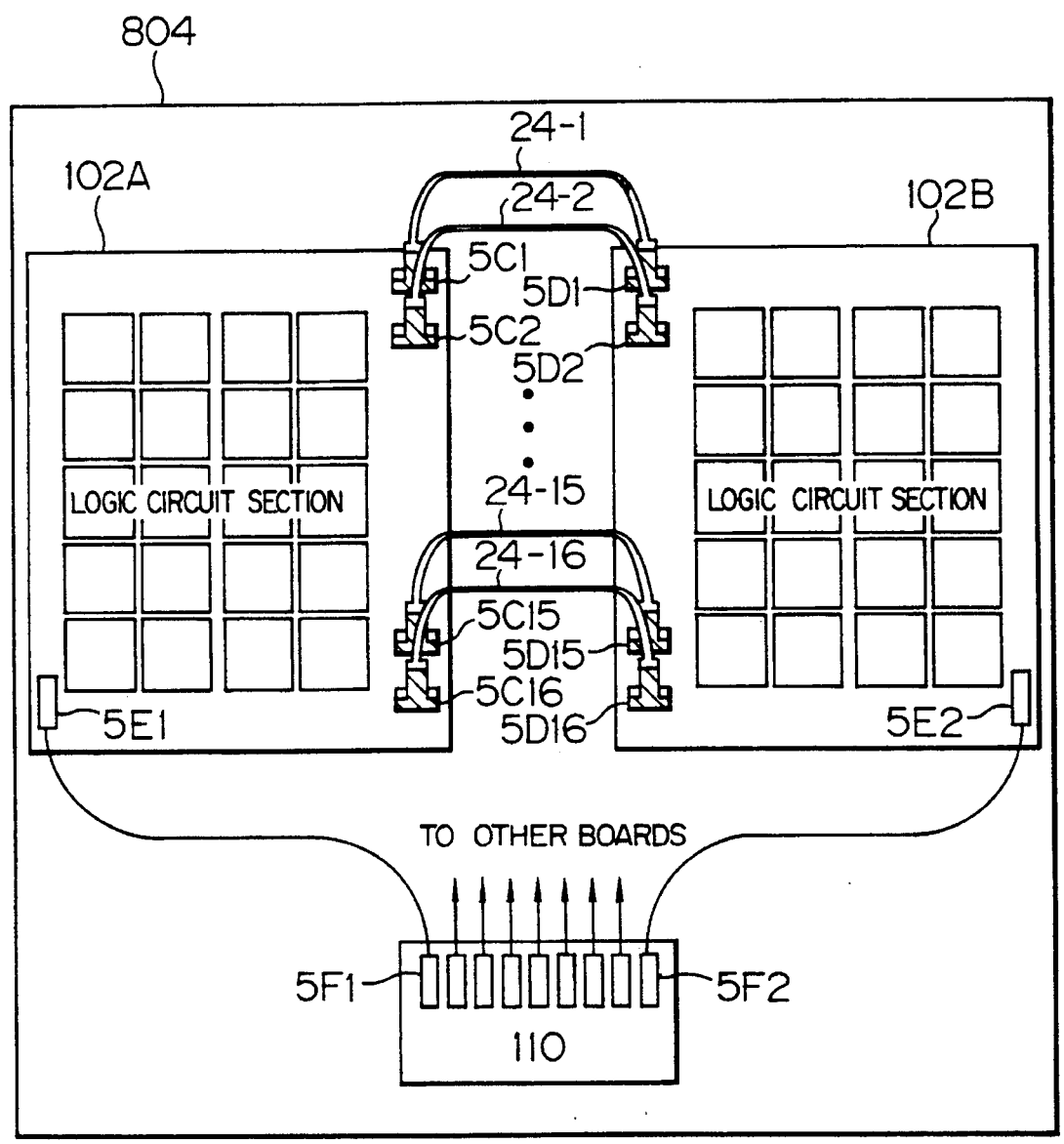
FIG. 13 shows the construction of a third embodiment of the present invention.

FIG. 13 shows the construction thereof. Transmitter and receiver modules 5C1~16 and 5D1~16 for parallel optical transmission are mounted on boards 102A and 102B in a logic device 804 and connected through fiber array cables 24-1~16. The transmitter and receiver modules 5C1~16 and 5D1~16 are constructed so as to have transmitting 64 channels and receiving 64 channels, i.e. 128 channels in all. Different devices are connected bidirectionally mutually through 2048 channels. Each of the fiber array cables 24-1~16 has 128 channels, which are constructed by bundling sixteen 8-channel fiber arrays. The transmitter - receiver modules 5C1~16 and 5D1~16 are connected directly with a 128-channel optical connector at one of each of the fiber array cables 24-1~16.

Clocks for the device 804 are supplied from a clock generating and distributing section 110. Clocks and synchronizing signals are distributed from the clock generating and distributing section 110 to boards 102A and 102B through cables having a same length so that the two boards 102A and 102B are driven synchronously. Distribution of the clocks and synchronizing signals was effected by using the transmitter - receiver module described in Embodiment 1. That is, they are distributed from the clock generating and distributing section 110 to the boards 102A and 102B through receiver modules 5E1 and 5E2 by transmitter modules 5F1 and 5F2.

The signal propagation time from the input pins to the output pins of the transmitter - receiver module is an integer times as long as the clock period. In the present embodiment the signal propagation time from the input pins to the output pins of the transmitter - receiver module was 12 ns, which corresponds to three clock periods of 4 ns. The reception output is latched by the clock for the boards within the transmitter - receiver module.

Figure 14:
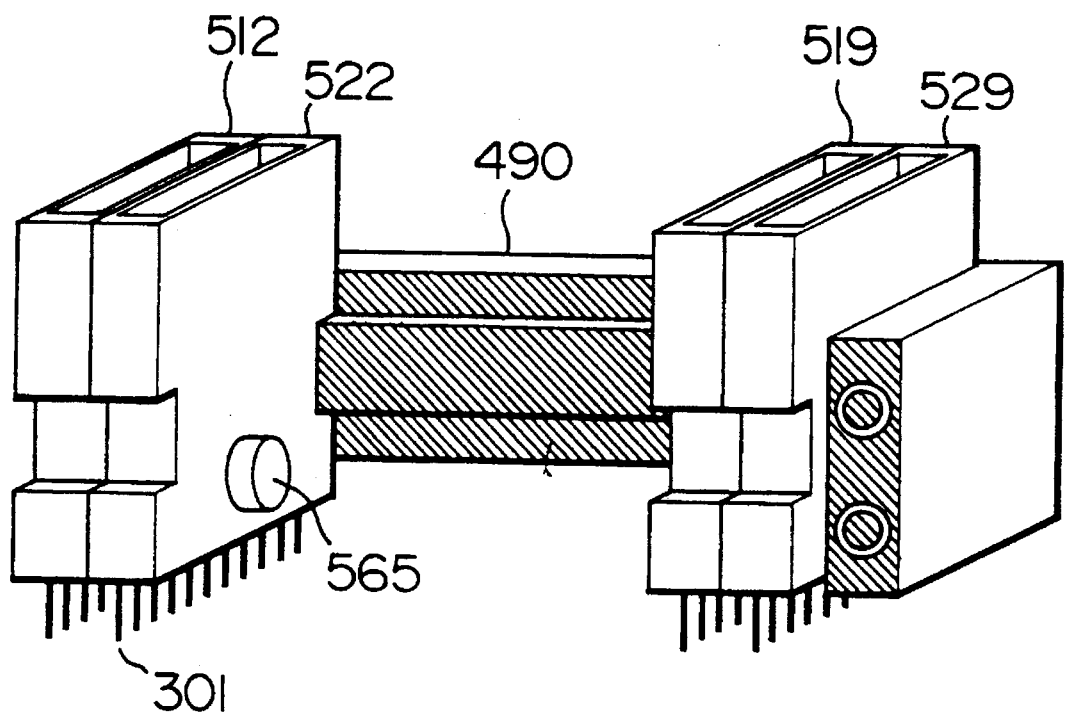
FIG. 14 shows the construction of a transmitter-receiver module for use in the embodiment of FIG. 13.

FIG. 14 indicates the construction of the transmitter - receiver modules 5C1~16 and 5D1~16 used in the present embodiment. Each of the transmitter - receiver modules is composed of 8 plug-in type transmitter submodules 512~9 and 8 plug-in type receiver submodules 522~9. These 16 submodules are fixed by a case 490 effecting also heat evacuation (only a part thereof being indicated in the figure). Each of the submodules has a positioning pin (pin 565 in the submodule 522) and a hole corresponding thereto (not seen in the figure). The submodule is secured in one body by the case together therewith.

Figure 15:
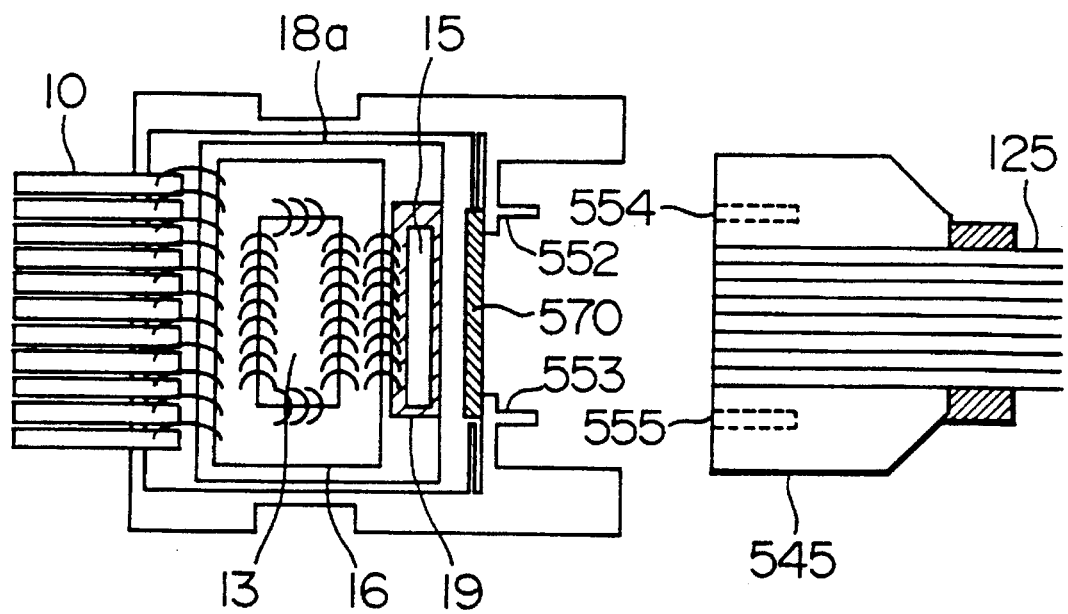
FIG. 15 shows the construction of a plug-in type transmitter submodule.

FIG. 15 indicates the construction of the plug-in type transmitter submodules 512~19. The transmitter submodule consists of 8 electric signal inputs and 3 pins for power supply 10; an IC substrate 16, on which a laser array driving IC 13 is mounted; a laser array 15 secured to a submount 19; a metal block 18a, to which the IC substrate 16 and the laser array submount 19 are secured by soldering; a microlens array 570 for airtightness and optical coupling; and ferrule positioning pins 552 and 553. For the laser arrays 15 and the laser array driving IC 13 those used in Embodiment 1 were used, whereby the number of channels was 8.

Figure 16:
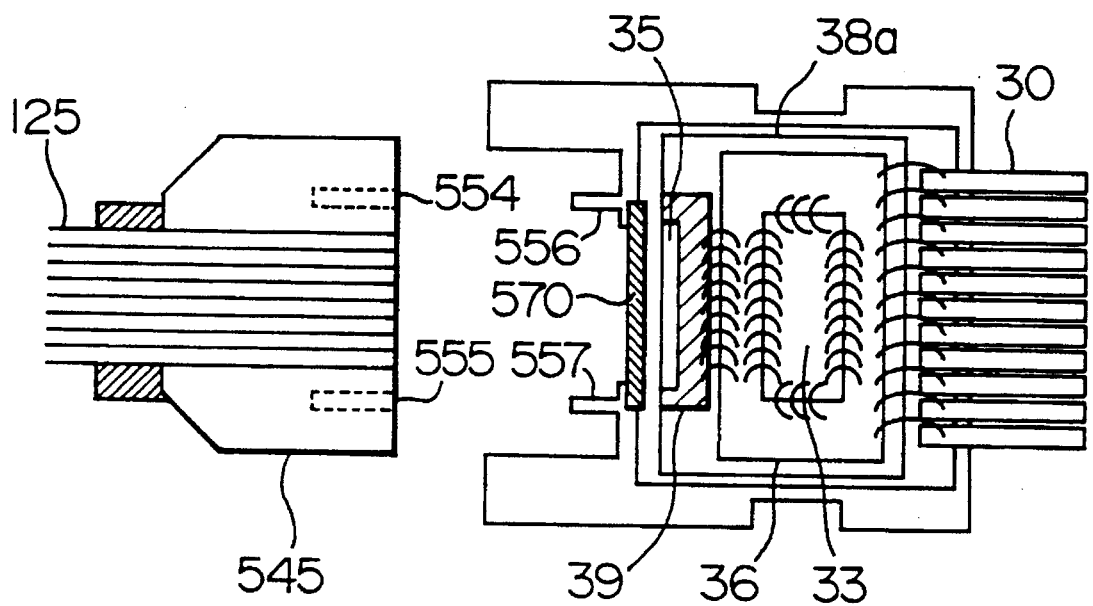
FIG. 16 shows the construction of a plug-in type receiver submodule 522"9.
Figure 17:
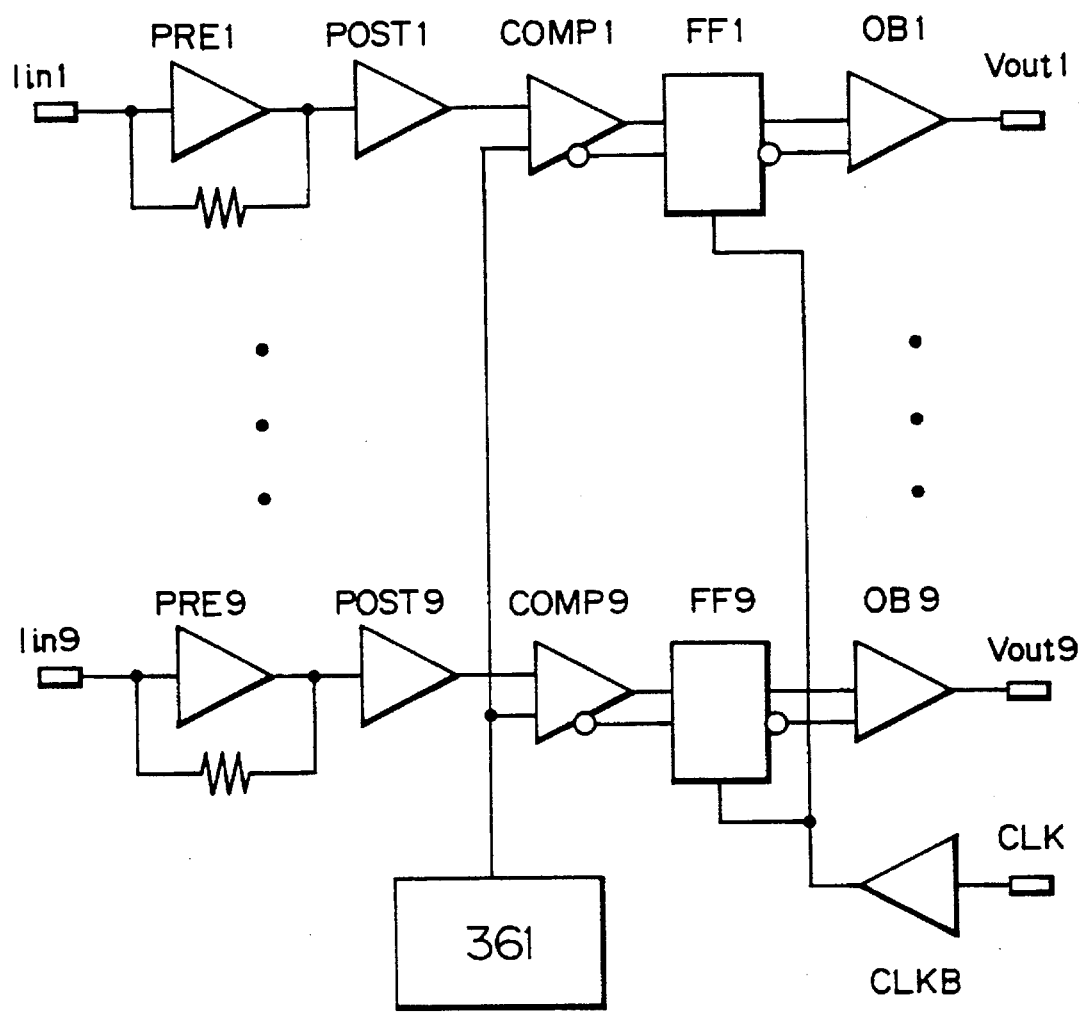
FIG. 17 is an equivalent circuit diagram of a receiving IC.

FIG. 16 indicates the construction of the plug-in type receiver submodules 522~9. The receiver submodule consists of 8 electric signal outputs and 3 pins for power supply 30; an IC substrate 36, on which a laser array driving IC 33 is mounted; a photodiode array 35 secured to a submount 39; a metal block 38a, to which the IC substrate 36 and the submount 39 are secured by soldering; a microlens array 570 for airtightness and optical coupling; and ferrule positioning pins 556 and 557. The photodiode arrays 35 were those used in Embodiment 1, in which the number of channels was 8. FIG. 17 indicates an equivalent circuit diagram of the receiving IC 33. Although it is identical to that used in Embodiment 1, data latches FF1~8, a clock input CLK and a clock buffer CKLB are added thereto. Received data are latched by clocks on the boards as described previously.

The transmitter submodules 512~19 and the receiver submodules 522~9 are of so-called plug-in type and optical coupling between the laser array 15 or the photodiode array 15 and the fiber arrays is realized directly by inserting the ferrule 545 into the package of the submodule, as indicated in FIGS. 15 and 16. At this time, optical axis adjustment is effected by means of pins 552, 553, 556 and 557 for positioning the submodule as well as ferrule guide pins 554 and 555.

In the transmitter - receiver module used in the present embodiment, the ICs are perpendicular to the plane, on which the boards 102A and 102B are mounted. This is because, if they were parallel thereto, the interval between the submodules would be determined by the chip size, which gives rise to a limit in downsizing.

In the present embodiment the fiber arrays were of multi-mode type and 2.24 m long. The propagation delay times in the transmitter module, the receiver module from the optical input to the latch, including the skew depending on light input, and the fiber array are 0.2 ns±70 ps, 0.6 ns±575 ps and 11.4 ns±40 ps, respectively, and it is 12.2 ns±685 ps in all. In this way it was possible to realize a relatively small skew with respect to the clock period of 4 ns.

Also in the present embodiment, single mode fiber arrays may be used similarly to the other embodiments. Further the latch in the receiver submodule can be omitted, if it is unnecessary (the ICs in Embodiment 1 being used), and it is possible also to use it properly, depending on the kind of signals. Still further it is possible also to dispose a latch for input signals in the transmitter module or to use properly a module with latch or without latch, depending on the kind of signals.

In addition, it is possible also to have a margin by setting a whole propagation delay time by taking into account (subtracting) a fixed delay on a board (for example a delay time from the closest logic section to the transmitter - receiver module) from a period an integer times as long as a clock period.

An extremely great number of synchronous transmissions in parallel can be effected by using a parallel optical transmission device according to the present invention, in which the propagation delay time from the input electric signal to the output electric signal is set in a predetermined region. In this way, it is possible to realize a high speed and high density wiring by making efficient use of lightness and fineness of a fiber.

Further it is possible to realize an extremely great number of synchronous transmissions in parallel, which are suitable for standardizing parts and excellent in mass productivity, easiness of maintenance and economic property, by utilizing a method, by which the propagation delay time in different constituent elements is controlled, in order to realize the above object.

Furthermore connecting work can be simplified and laying work is made easier by bundling fiber bundles, for which the propagation delay time is controlled for every bundle.

In addition, synchronized boards or devices can be connected without data synchronization by relating the clock period to the propagation delay time. Still further the present invention can be used also for distributing clocks or synchronizing signals for synchronizing boards or devices.

The devices according to the present invention can be mounted with a high density by making transmitters, receivers or both in one body by using positioning pins, etc. Mounting density can be increased further by devising the mounting of ICs.

What is claimed is:

1. A parallel optical transmission device comprising:
   a transmitter section having a plurality of transmitter modules converting a plurality of input electrical signals into optical signals;
   a section consisting of bundles of optical waveguides $20i$, $j$ transmitting said optical signals, one end of said bundles being connected with said transmitter section; and a receiver section having a plurality of receiver modules reproducing the electrical signals from said optical signals thus transmitted to output them, said receiver section being connected with the other end of said bundles;

wherein all propagation delay times from said input electrical signals to the output electrical signals are set in predetermined regions.

2. A parallel optical transmission device comprising:

a transmitter section having a plurality of transmitter modules converting a plurality of input electrical signals into optical signals;

a section consisting of bundles of optical waveguides 20i, j transmitting said optical signals; and a receiver section having a plurality of receiver modules reproducing the electrical signals from said optical signals thus transmitted to output them;

wherein all propagation delay times from said input electrical signals to the output electrical signals are set in predetermined regions, and said plurality of transmitter modules and bundles of optical waveguides connected directly with said transmitter modules are formed in one body.

3. A parallel optical transmission device comprising:

a transmitter section having a plurality of transmitter modules converting a plurality of input electrical signals into optical signals;

a section consisting of bundles of optical waveguides 20i, j transmitting said optical signals; and a receiver section having a plurality of receiver modules reproducing the electrical signals from said optical signals thus transmitted to output them;

wherein all propagation delay times from said input electrical signals to the output electrical signals are set in predetermined regions, and said plurality of receiver modules and bundles of optical waveguides connected directly with said receiver modules are formed in one body.

4. A parallel optical transmission device comprising:

a transmitter section having a plurality of transmitter modules converting a plurality of input electrical signals into optical signals;

a section consisting of bundles of optical waveguides 20i, j transmitting said optical signals; and a receiver section having a plurality of receiver modules reproducing the electrical signals from said optical signals thus transmitted to output them;

wherein all propagation delay times from said input electrical signals to the output electrical signals are set in predetermined regions, and said plurality of transmitter modules, bundles of optical waveguides connected directly with said transmitter modules, and said receiver modules connected with said bundles of optical waveguides are formed in one body.

5. A parallel optical transmission device comprising:

a transmitter section having a plurality of transmitter modules converting a plurality of input electrical signals into optical signals;

a plurality of bundles of optical waveguides transmitting said optical signals, one end of said bundles being connected with said transmitter section; and a receiver section having a plurality of receiver modules reproducing the electrical signals from said optical signals thus transmitted to output them, said receiver section being connected with the other end of said bundles;

wherein the difference between optical signals propagation times of the respective bundles is set in predetermined regions.

6. A parallel optical transmission device comprising:

a transmitter section having one transmitter module converting input electrical signals into optical signals;

a section consisting of bundles of optical waveguides 20i, j transmitting said optical signals, one end of said bundles being connected with said transmitter section; and a receiver section having one receiver module reproducing the electrical signals from said optical signals thus transmitted to output them, said receiver section being connected with the other end of said bundles;

wherein all propagation delay times from said input electrical signals to the output electrical signals are set in predetermined regions.

7. A bi-directional parallel optical transmission device, comprising:

a plurality of first transmitter-receiver modules each module including a transmitter module converting a plurality of input electrical signals into optical signals and a receiver module reproducing second electrical signals from other optical signals; and a plurality of second transmitter-receiver modules each including a second transmitted module converting a plurality of said second input electrical signals into said other optical signals and a second receiver module reproducing said plurality of input electrical signals from said optical signals coupling said plurality of first and second transmitter-receiver modules, wherein all propagation delay times of input electrical signals are set in predetermined regions.

* * * * *